WIDE-BAND HIGH FREQUENCY PRE-AMPLIFIER CIRCUITS

Filed May 26, 1951

INVENTOR
Steven Wlasuk
BY [signature]
ATTORNEY

United States Patent Office 2,743,323

Patented Apr. 24, 1956

2,743,323

WIDE-BAND HIGH FREQUENCY PRE-AMPLIFIER CIRCUITS

Steven Wlasuk, Brooklawn, N. J., assignor to Radio Corporation of America, a corporation of Delaware Application May 26, 1951, Serial No. 228,438

5 Claims. (Cl. 179—171)

Figure 1:
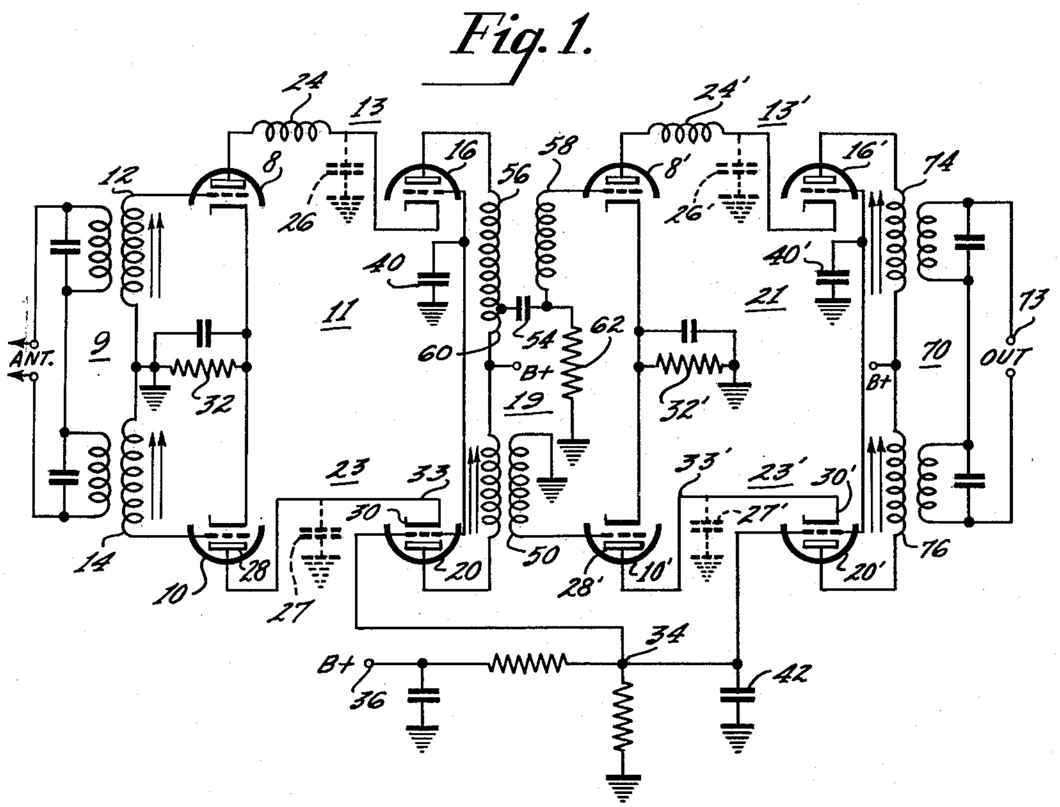

This invention relates in general to wide-band high-frequency amplifier circuits, and more particularly to fixed tuned amplifiers suitable for wide-band pre-amplification of television signals, or the like.

In large apartment buildings it is desirable to operate a multiplicity of television receivers from a system employing a single advantageously located antenna. However, such systems cause signal losses resulting in poor pictures at the television receivers because of a less desirable signal-to-noise ratio than possible with individual antennas. Accordingly a pre-amplifier circuit is desirable for increasing the signal strength at the television receiver. Such an amplifier circuit must itself have a very good signal-to-noise ratio to provide good television pictures.

Accordingly it is an object of the present invention to provide television pre-amplifier circuits having good signal-to-noise characteristics.

Low-noise pre-amplifier circuits are also desirable in fringe areas to increase the signal strength to the value required for proper receiver operation. It is difficult to provide the requisite amount of signal gain over such a broad band of frequencies necessary to include all the television channels presently allocated in the United States. This may be done by a tunable amplifier, more readily than with a wide-band amplifier. However, for both fringe area operation and antenna distribution systems it becomes inconvenient to tune the pre-amplifier circuit as well as the television receiver.

Therefore, it is another object of the present invention to provide wide-band high-frequency amplifier circuits affording high signal gain.

Because the noise characteristic of a triode amplifier is inherently better than a pentode amplifier, the triode is preferred where tube noise becomes important. It is preferable to have the gain and stability of a pentode amplifier, however, for high-frequency operation. Accordingly an amplifier circuit is provided for use in the present invention providing the desirable characteristics of both pentode and triode amplifiers. The basic amplifier circuit itself is shown and described in detail in the copending United States application of P. C. Swierczak, Ser. No. 219,263, filed April 4, 1951.

Improved high-frequency operation of the present invention results because of circuit simplicity. Circuit noises are generally introduced, as well as signal losses, by the tendency of stray inductances and capacities of extra component parts to resonate and cause spurious responses, absorption of signal, or feedback resulting in unpredictable amplifier characteristics.

Thus, a further object of the invention is to provide improved and simplified high-frequency amplifier circuits suitable for use in television pre-amplifier systems, or the like.

In accordance with the invention there is therefore provided an improved amplifier system comprising a signal amplification path for a wide range of frequencies including a higher and lower frequency band. These frequency bands may for example include those to which the present United States standard television channels 2 to 6 and 7 to 13 are allocated. The signal amplification path includes two units consisting of a pair of juxtapositioned tandem-connected multiple tube amplifier circuits. The tubes, or other discharge devices, have series-connected direct-current discharge paths. One of each pair of tandem-connected circuits amplifies corresponding signals within a single one of said frequency bands. The series connected paths make possible the use of a common anode or high potential source as well as a common cathode bias circuit connected in the direct current return path of both units.

Figure 2:
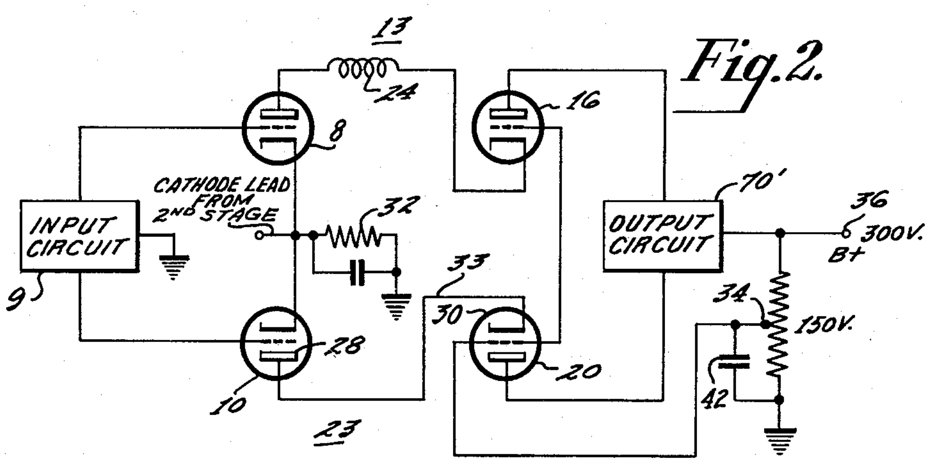

The features of the invention which are believed novel are set forth with particularity in the appended claims. The invention itself, however, both as to its organization and mode of operation together with further objects and advantages thereof, may best be understood by reference to the following description when considered in connection with the accompanying drawings, in which:

Figure 1 is a schematic circuit diagram of a wide-band high-frequency amplifier embodying the invention; and, Figure 2 is a simplified schematic circuit diagram, partially in block form, of a portion of the amplifier of Figure 1.

Like reference characters represent like circuit components in each of the figures of the drawing. Referring now particularly to the drawing, an input circuit 9 is provided such as the input transformer networks connecting the antenna terminals to the input electrodes of a pair of triode amplifier sections 8 and 10 of a double triode electronic tube such as RCA type 12AT7. As shown in Figure 2 these triode sections may be separate tubes, if desired. However, the present circuit is designed so that multiple-section tubes may be advantageously used without adverse effects, and are thus preferred because of the savings in construction cost and the shorter lead lengths possible.

The input transformer sections 12 and 14 are broadly tuned respectively to a mid-frequency in the high and low frequency portions of the television bands. Accordingly the transformer section 12 will be tuned in the vicinity of 190 megacycles for operation within channels 7 to 13. Likewise the transformer section 14 will be tuned in the vicinity of 70 megacycles for operation within channels 2 to 6. Both transformers have tightly coupled primary and secondary windings to provide the proper bandwidth necessary for continuous operation throughout the respective frequency bands of 175 to 215 megacycles and 55 to 90 megacycles.

The pre-amplifier circuit comprises two stages of amplification 11 and 21. Each stage has a pair of units 13 and 23 consisting of juxtapositioned amplifier circuits, and the stages are coupled by a signal transfer circuit 19. Each unit consists of a pair of tandem amplifier tubes 8 and 16, 10 and 20, having series-connected direct-current discharge paths. As before mentioned the amplifiers and their operational features are fully described in the copending Swierczak application. Therefore only the features necessary for a complete understanding of the present invention are hereinafter described in connection with the tandem series-connected or totem-triode amplifiers.

The upper unit 13 of each stage is provided for operation throughout the higher frequency band, and conversely the lower unit 23 of each stage is provided for operation throughout the lower frequency band. At the higher frequencies the inter-tube coupling circuit within each unit consists of the inductor 24. This inductor has a value of about .15 microhenries and provides with the capacitance 26 a series resonant circuit. Capacitance 26 is comprised essentially of the cathode to ground inter-electrode capacity of the second tube section 16 and stray wiring capacity, and is of the order of 5 $\mu\mu$f. The resulting series-resonant circuit is therefore tuned to a mid-frequency of the upper television band. The series resonant circuit thereby presents a low signal output impedance to the first tube section 8 for signals within the upper frequency band. Since the input circuit for the first tube section is tuned, other signals are attenuated and may therefore be considered negligible.

Operation with very low anode load impedance of the first tube section 8 for signal frequencies thus permits high frequency amplification with a triode without neutralizing circuits. Further the input capacitance 26 for the second tube section 16 gives a resonant circuit voltage gain of *e*Q where "*e*" is voltage applied to the resonant circuit and "Q" is the circuit Q. High gain comparable to pentode gain is therefore provided. This simplified circuit therefore provides the advantages of both triode and pentode operation, and in addition is simple to construct. The simplified construction as well contributes to improved performance at high frequencies because of decreased losses and spurious responses.

For low frequency operation the unit 23 has direct coupling by means of the conductive lead 33 between the anode 28 and cathode 30 of the first and second tube sections 10 and 20, respectively. The input capacitance 27 of the second tube section 20 at the lower frequencies provides a high impedance signal load for the first tube section 10 and an input circuit for the second tube section 20. Neutralization is not necessary in the first tube section 10 of this unit 23 because of the high impedance of the plate-to-grid inter-electrode path at the lower frequencies.

With the described circuit connections the gain of both units is approximately the same. For the approximately 40 megacycle bandpass requirements of the upper and lower television bands, a gain of 6 per stage is readily recognized with high mu triodes, such as the 12AT7 type. Thus a two-stage amplifier embodying four double-triode tubes may give an overall gain of about 36 as compared with a gain of 10 usually possible with a sixteen stage conventional broad-band amplifier having a passband covering the entire television frequency spectrum.

Less inter-stage coupling is afforded when multiple-section tubes 8—28 and 16—20 are used, if arranged as shown in Figure 1 of the drawing. This is important to prevent cross-coupling in high-frequency operation, because ordinary tubes may thereby be used without intersectional shields. This feature further decreases the construction expense of the amplifier circuit without sacrificing amplifier performance. Because tube sections 8 and 28 are operating within different frequency bands the tuned circuits associated therewith attenuate any signals which might tend to be coupled between the tube sections.

Further circuit simplification is afforded by the present invention because a single common by-passed cathode bias resistor 32 is used for all four tube sections in the two units of each stage. This resistor 32 provides a cathode bias circuit for the first tube section 8, 28 for each unit 11, 21. The second tube sections 16, 20 are biased with a positive potential at terminal 34 equal to about half the B+ potential at terminal 36. Since the direct-current potential drop across each tube section is essentially half the anode supply this connection effectively provides zero grid or control-electrode bias for the second tube section 16, 20 of each unit. Accordingly the changes in potential at the cathode bias resistor 32, because of the common anode current return path for both units 13 and 23 therethrough, and the resulting changes in direct-current potential drop across the first tube sections 8 and 10 operate to bias the second tube sections 16 and 20 and maintain a favorable impedance balance of both tube sections of each unit. A single cathode bias resistor 32 may be used for both stages if desired to effect further circuit simplification, as shown in Figure 2.

Grounded-grid operation of the second tube section 16, 20 of each unit is maintained by the respective capacitors 40 and 42. The by-pass capacitor 42 is in general sufficient in the lower frequency units 23 to maintain signal ground potential on the tube grids. However, in the higher frequency units 13, the lead lengths and the inherent inductance of the larger by-pass capacitor 42 presents sufficient impedance to be objectionable. The separate small radio-frequency by-pass capacitors 40 are therefore preferably provided close to the grid terminal of tube sections 16.

For a discussion of further advantageous features attained by the series-coupled relationship of the tandem tubes 8, 16 and 10, 20, the above-identified copending application may be referred to. Therein it is shown that the grid-input anode-output relationship of the first tube section 8, 10 or driving tube in combination with the cathode-input grounded-grid relationship of the second tube section 16, 20 or driven section provides a high-gain low-noise amplifier particularly adapted for high frequency operation and operable without neutralizing circuits.

The inter-stage coupling circuit 19 comprises a conventional magnetically coupled transformer 50 for signal transfer between units 23 and 23' corresponding to the lower frequency band. The coupling means between the respective output and input elements of each stage in the units 13 corresponding to the higher frequency band comprises the capacitor 54. No mutual coupling is provided between the respective output and input inductors 56 and 58. A portion 60 of the output inductor 56 is commonly included in the signal impedance path of the grid-input circuit of tube section 8, because grid leak resistor 62 presents a very high signal frequency impedance. This high-frequency coupling circuit is preferable to conventional transformer coupling since it provides a much lower tube-to-tube capacity between tube sections 16 and 8', as well as improved coupling stability at the higher operation frequencies.

At the output circuit 70 there is therefore provided high-amplitude low-noise signals throughout the presently assigned television channels. It is to be recognized, however, that other than television high-frequency wide-band operation could be effected by those skilled in the art in accordance with the present disclosure of the invention without departing from the scope of the invention.

At the output terminals 73 a balanced or symmetrical input circuit is provided for connection to the conventional receiver antenna input terminals. High and low frequency band signals are developed respectively at the output transformer sections 74 and 76 to provide optimum coupling to the usual 300 ohm receiver input circuit, or the like.

Therefore there is provided in accordance with the present invention a simplified and improved amplifier circuit, which is well adapted for use in a television preamplifier system. From a consideration of the circuit of Figure 2 it is easily recognized that the amplifier circuit of the invention is highly desirable because of the inexpensive construction thereby afforded. The circuit simplicity provides improved high frequency operation, in addition, because of decreased stray and wiring capacities possible, and the preclusion of signal losses in otherwise necessary circuit components. Thus, a simplified amplifier circuit is provided in accordance with the invention without the sacrifice of performance.

What is claimed is:

1. In a signal amplifying system adapted for simultaneously communicating a first band of relatively high frequency signals and a second band of relatively low frequency signals, the combination of: a source of power supply voltage having a positive and a negative terminal; a first and second amplifier device serially connected with one another across said voltage source; a relatively high resonant frequency input circuit connected with said first amplifier device; a relatively high resonant frequency output circuit connected with said second amplifier device;

an inductance means interposed between the serial connection of said first and said second amplifier devices; a third and a fourth amplifier device serially connected with one another across said voltage source; a relatively low resonant frequency input circuit connected with said third amplifier device; a relatively low resonant frequency output circuit connected with said fourth amplifier device; signal coupling means connected between said first tube input circuit and said third tube input circuit to permit application of common input signals to both input circuits; signal coupling means connected between said second tube output circuit and said fourth tube output circuit to permit combining of high band and low band output signals; and resistance means connected in series with both said first and said third amplifier device.

2. In a signal amplifying system according to claim 1, wherein said first and said second amplifying device are each triode electron discharge tubes, each having an anode, cathode and control electrode, wherein said resistance means is connected between the negative terminal of said power supply voltage source and the cathodes of both said first and said third triodes.

3. In a signal amplifying system according to claim 2, wherein there is additionally provided bias voltage supply means having a terminal displaying a voltage of positive polarity with respect to said first and said third triode cathodes but of negative polarity with respect to said second and said fourth triode cathodes and a connection from said bias means terminal to the control electrodes of said second and said fourth triode amplifier devices.

4. In a signal amplifying system according to claim 2, wherein the value of said inductance is selected to resonate with the capacitance value existing between said second triode cathode and negative power supply voltage terminal at a frequency falling within said first band of relatively high frequency signals.

5. In a broad band preamplifier system adapted for simultaneous amplification of separate groups of different television broadcast channel signals, one group falling in a higher frequency band and another group falling in a lower frequency band, the combination of: a set of input terminals and a set of output terminals for said preamplifier system; a source of power supply voltage having a positive and a negative terminal; a first and a second electron discharge tube each having at least an anode, cathode and control electrode; a resistance means connected from the cathode of said first tube to said power supply negative terminal; an inductance means connected from the anode of said first tube to the cathode of said second tube; a first resonant output circuit means connected from the anode of said second tube to the power supply positive terminal, said resonant output circuit means having a resonant characteristic falling within the higher band of television signal channels; a first resonant input circuit means connected between the control electrode of said first tube and the said power supply negative terminal, said first resonant input circuit means having a resonance characteristic falling within the higher band of television signal channels; a third and a fourth electron discharge tubes, each having at least an anode, cathode and control electrode; a connection from said third tube cathode to said first tube cathode; a substantially direct connection of negligible inductance between said third tube anode and said fourth tube cathode; a second resonant output circuit means connected between said fourth tube anode and said power supply positive terminal, said second resonant output circuit means having a resonance characteristic falling within the lower frequency band of television signal channels; a second resonant input circuit means connected between the control electrode of said third tube and said power supply negative terminal, said second resonant input circuit means having a resonance characteristic falling within the lower frequency band of television signal channels; signal coupling means between said first and said second resonant input circuit means and said amplifier system input terminals; signal coupling means connected between said first and said second resonant output circuit means and said amplifier system output terminals; and bias means connected with the control electrodes of said second and said fourth tubes.

References Cited in the file of this patent

UNITED STATES PATENTS

| | | |
|---|---|---|
| 2,329,073 | Mitchell et al. | Sept. 7, 1943 |
| 2,424,893 | Mansford | July 29, 1947 |
| 2,428,295 | Scantlebury | Sept. 30, 1947 |
| 2,561,425 | Stachura | July 24, 1951 |
| 2,631,198 | Parisoe | Mar. 10, 1953 |

OTHER REFERENCES

Publication, RCA Review, March 1951, "Use of New Low-Noise Twin Triode in Television Tuners," pp. 3 to 26.